(12) United States Patent
McLaurin

(10) Patent No.: US 7,308,631 B2
(45) Date of Patent: Dec. 11, 2007

(54) WRAPPER SERIAL SCAN CHAIN FUNCTIONAL SEGMENTATION

(75) Inventor: Teresa Louise McLaurin, Dripping Springson, TX (US)

(73) Assignee: Arm Limited, Cambridge (GB)

( * ) Notice: Subject to any disclaimer, the term of this patent is extended or adjusted under 35 U.S.C. 154(b) by 598 days.

(21) Appl. No.: 10/242,439

(22) Filed: Sep. 13, 2002

(65) Prior Publication Data

US 2005/0283690 A1   Dec. 22, 2005

(51) Int. Cl.
*G01R 31/28*   (2006.01)

(52) U.S. Cl. ..................................... 714/726

(58) Field of Classification Search ............... 714/726, 714/727, 729
See application file for complete search history.

(56) References Cited

U.S. PATENT DOCUMENTS 5,757,819 A * 5/1998 Segars ..................... 714/727

* cited by examiner

*Primary Examiner*—James C. Kerveros
(74) *Attorney, Agent, or Firm*—Nixon & Vanderhye P.C.

(57) ABSTRACT

A wrapper serial scan chain used during test of an integrated circuit is provided for a first functional block of circuitry and is segmented to provide a separately accessible wrapper serial scan chain segment that can be used to apply test to a second functional block of circuitry while bypassing the rest of the main wrapper serial scan chain.

14 Claims, 7 Drawing Sheets

WRAPPER SERIAL SCAN CHAIN FUNCTIONAL SEGMENTATION

BACKGROUND OF THE INVENTION

1. Field of the Invention

This invention relates to the field of data processing systems. More particularly, this invention relates to the provision and use of wrapper serial scan chains for testing circuitry.

2. Description of the Prior Art

There is a need to provide thorough and efficient testing mechanisms for testing integrated circuits. One known technique for testing integrated circuits uses wrapper serial scan chains to apply input signals to and capture output signals from the inputs and outputs associated with a circuit. In a simple system in which only a single functional block is provided on an integrated circuit, the wrapper serial scan chain may serve to apply input signals to and capture output signals from all of the pins associated with the integrated circuit. With more complicated and modern designs it is becoming increasingly common for several functional blocks of circuitry to be combined together on a single integrated circuit to provide a so called system-on-chip design. Such a design is schematically illustrated in FIG. 1 of the accompanying drawings.

FIG. 1 illustrates an integrated circuit 2 which includes a microprocessor core 4, a vector floating point unit 6, an embedded trace module 8 and a block of user defined logic 10. The modular nature of such designs has the result that different functional blocks of circuitry tend to have their own wrapper serial scan chains associated with them for testing their behaviour. In the example shown in FIG. 1, the microprocessor core 4, the vector floating point unit 6 and the embedded trace module 8 all have associated wrapper serial scan chains 5 for use in the testing of those functional blocks of circuitry. The user defined logic 10 does not have its own wrapper serial scan chain. As illustrated in FIG. 1, the microprocessor core 4 is coupled to each of the other functional blocks 6, 8, 10 within the integrated circuit 2. The microprocessor core 4 has a long wrapper serial scan chain, which might typically be several hundreds of serial scan chain cells (flip flops) in length.

A problem that arises during such testing as the integrated circuits under test increase in complexity and size is that the length of the wrapper serial scan chains tends to increase which has a direct result upon the time required to scan in a full set of test vectors and scan out the results. Furthermore, the testing systems required to deal with long wrapper serial scan chains tend to be more complicated and require greater memory resources. In the example illustrated in FIG. 1, it will be seen that if it is desired to simply test the user defined logic 10 which is coupled to the wrapper serial scan chain of the microprocessor core 4, it is necessary to scan in a set of test vectors to the full wrapper serial scan chain of the microprocessor core 4 so that the appropriate pattern of signals can be applied to the user defined logic and captured from the user defined logic. This is inefficient.

SUMMARY OF THE INVENTION

Viewed from one aspect the present invention provides a testing circuit operable to test an integrated circuit having a first functional block of circuitry coupled to a second functional block of circuitry, said testing circuit comprising:

at least one wrapper serial scan chain having a wrapper serial input and a wrapper serial output and being operable to apply a set of input signals to said first block of circuitry and to capture a set of output signals from said first block of circuitry; wherein said wrapper serial scan chain includes a wrapper serial scan chain segment operable to apply and to capture signals passed between said first functional block of circuitry and said second functional block of circuitry; and a segment selector operable to selectively connect said wrapper serial scan chain segment to said wrapper serial input and to said wrapper serial output whilst bypassing at least a portion of said wrapper serial scan chain outside of said wrapper serial scan chain segment such that a set of input signals can be applied to said second functional block of circuitry and a set of output signals captured from said second functional block of circuitry without requiring signal values to be scanned through all of said wrapper serial scan chain.

The invention recognises that considerable advantage may be achieved by segmenting a wrapper serial scan chain into portions associated with different functionality thereby enabling a particular functional block to be driven by a selected segment of a full wrapper serial scan chain whilst the rest of that full wrapper serial scan chain is bypassed. This requires less scanning in and scanning out of data coupled with lower memory usage whilst still enabling proper test coverage of the target functional block of circuitry to be achieved.

A further advantage that may be achieved by this functional segmentation of the wrapper serial scan chain is that functional blocks that previously had their own wrapper serial scan chain can instead at least partially replace this by a corresponding portion of the wrapper serial scan chain associated with a different functional block with which they connect via a predetermined signal interface. Thus, in the example of FIG. 1, the vector floating point unit 6 is illustrated as having its own wrapper serial scan chain whereas in practice it only receives inputs from the microprocessor core 4 and only generates outputs to the microprocessor core 4 and accordingly this separate wrapper serial scan chain for the vector floating point 6 is a duplication of the portion of the wrapper serial scan chain associated with the microprocessor core 4. The present technique enables inefficiency to be overcome by providing segmentation of the wrapper serial scan chain of the microprocessor 4 such that the portion which interfaces with the vector floating point unit 6 can be selected for connection to the serial input and serial output with the rest of the wrapper serial scan chain of the microprocessor core 4 being bypassed. Thus, it is possible to efficiently test the vector floating point units 6 whilst avoiding the need for a separate and effectively redundant dedicated wrapper serial scan chain for the vector floating point unit 6. This may also allow the removal of unnecessary circuitry between different portions of the systems on what may be critical paths. Whilst the advantage of this aspect of the invention has been discussed in relation to a vector floating point unit 6 it will be understood that this advantage more widely applies to a considerable variety of functional blocks of circuitry which communicate via a predetermined interface.

A further advantage of the segmentation of such an interface between functional blocks is that if a functional block is reused in another system, then providing the interface has not been changed then test vectors may be reused saving considerable effort and time.

Whilst it will be appreciated that the segment selector could be operable to bypass only a portion of the full wrapper serial scan chain and still yield an efficiency advantage, in preferred embodiments of the invention the segment selector is operable to bypass all of the wrapper serial scan chain other than that which is part of the wrapper serial scan chain segment.

Although the present techniques are applicable to a wide range of functional blocks of circuitry (such functional blocks of circuitry are typically provided to perform separate functions within an overall system-on-chip design and may sometimes be designed by different organizations), they are particularly well suited to situations in which the first functional block of circuitry is a microprocessor and the second functional block of circuitry is one of a coprocessor, a floating point unit, an embedded trace unit or application specific logic. Microprocessor cores typically have relatively long wrapper serial scan chains associated with them and are coupled by predetermined interfaces to the various other functional blocks within a system-on-chip design and accordingly lend themselves well to the above techniques for improving test efficiency.

As previously mentioned, the current technique enables the reuse of the wrapper serial scan chain segment to at least partially provide the wrapper serial scan chain for the second functional block of circuitry, although this feature is not essential to the broader aspects of the present invention.

The wrapper serial input and wrapper serial output are preferably provided in the form of external pins to the integrated circuit under test.

Viewed from another aspect the present invention provides a method of testing an integrated circuit having a first functional block of circuitry coupled to a second functional block of circuitry, said method comprising the steps of:

in a first test mode, using at least one wrapper serial scan chain having a wrapper serial input and a wrapper serial output to apply a set of input signals to said first block of circuitry and to capture a set of output signals from said first block of circuitry; and in a second test mode, selectively connecting a wrapper serial scan chain segment within said wrapper serial scan chain to said wrapper serial input and to said wrapper serial output whilst bypassing at least a portion of said wrapper serial scan chain outside of said wrapper serial scan chain segment and using said wrapper serial scan chain segment to apply and to capture signals passed between said first functional block of circuitry and said second functional block of circuitry without requiring signal values to be scanned through all of said wrapper serial scan chain.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
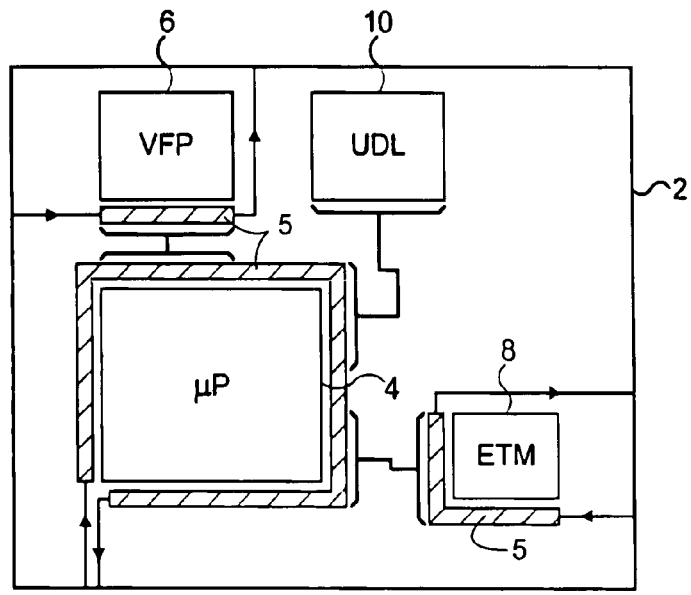
FIG. 1 schematically illustrates a system-on-chip integrated circuit including a plurality of functional blocks of circuitry.
Figure 6:
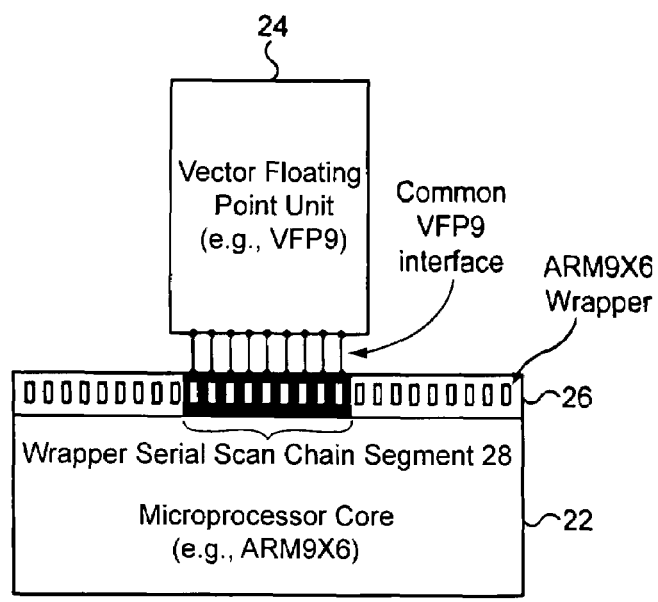
FIG. 6 is a diagram schematically illustrating the relationship between two functional blocks of circuitry with a segment of a wrapper serial scan chain being shared between the two functional blocks of circuitry.

FIG. 1 schematically illustrates an integrated circuit 2 incorporating multiple functional blocks of circuitry including a microprocessor core 4, a coprocessor being in this particular example a vector floating point unit 6, an embedded trace module 8 and user defined logic 10. The microprocessor core 4, the vector floating point unit 6 and the embedded trace module 8 have associated wrapper serial scan chains 5 which can be used to apply test vectors to those circuit elements. The integrated circuit 2 is a system-on-chip design incorporating multiple functional blocks, which may be sourced from different suppliers and of which the system-on-chip integrator need not necessarily have full knowledge regarding their internal design. It will be appreciated that whilst FIG. 6 illustrates a coprocessor in the form of a vector floating point unit 24 connected to a microprocessor in the form of an ARM9X6 microprocessor 22, many different possibilities exist for the first and second functional blocks of circuitry, such as coprocessors in general and microprocessors in general When it is desired to test the user defined logic 10 which does not have its own wrapper serial scan chain, it is necessary to scan in a test vector to the wrapper serial scan chain of the microprocessor core 4 and then perform an external test operation such that the relevant signals are driven out to the user defined logic 10 and/or captured from the user defined logic 10.

Figure 2:
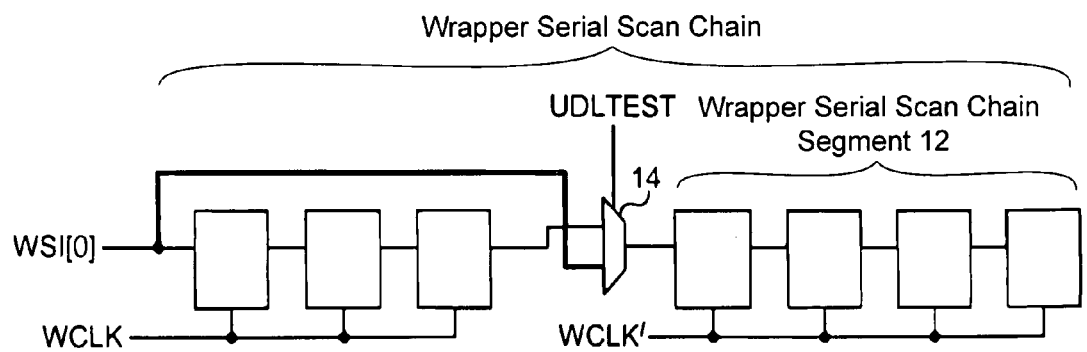
FIG. 2 schematically illustrates a wrapper serial scan chain which is functionally segmented.

FIG. 2 schematically illustrates how a wrapper serial scan chain may be provided with a wrapper serial scan chain segment 12 which can be used to apply test vectors to the user defined logic 10 whilst the rest of the wrapper serial scan chain cells are bypassed. The multiplexer 14 acting under control of a mode selecting signal UDLTEST serves to bypass a portion of the full wrapper serial scan chain cell such that shorter test vectors including only those signal values needed for the user defined logic 10 can be scanned into and out of the selected segment 12. It will be appreciated that the action of the multiplexer 14 is to functionally segment the wrapper serial scan chain cell as a whole so as to achieve more rapid testing.

Figure 3:
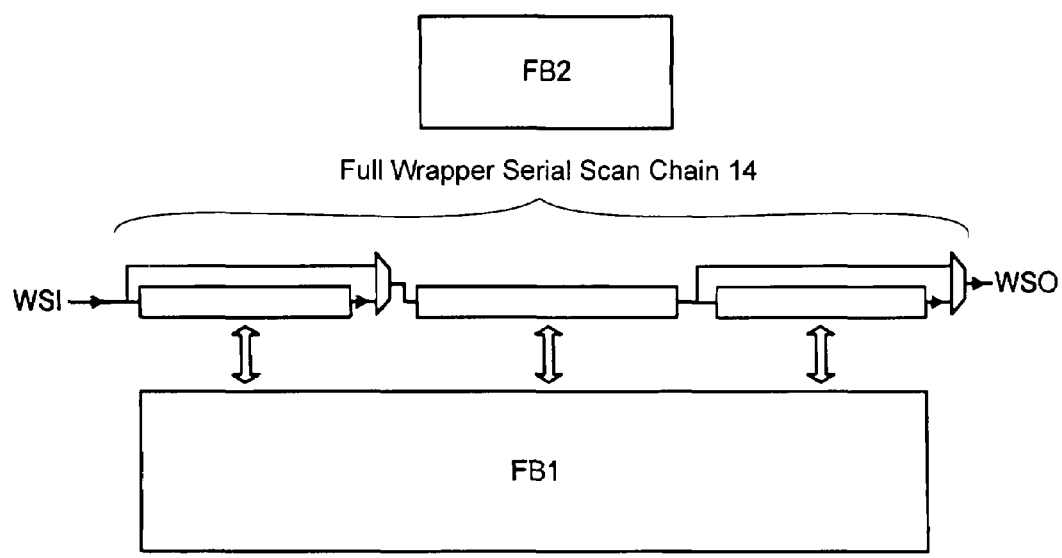
FIGS. 3 and 4 schematically illustrate the operation of a wrapper serial scan chain in different segmented modes.
Figure 4:
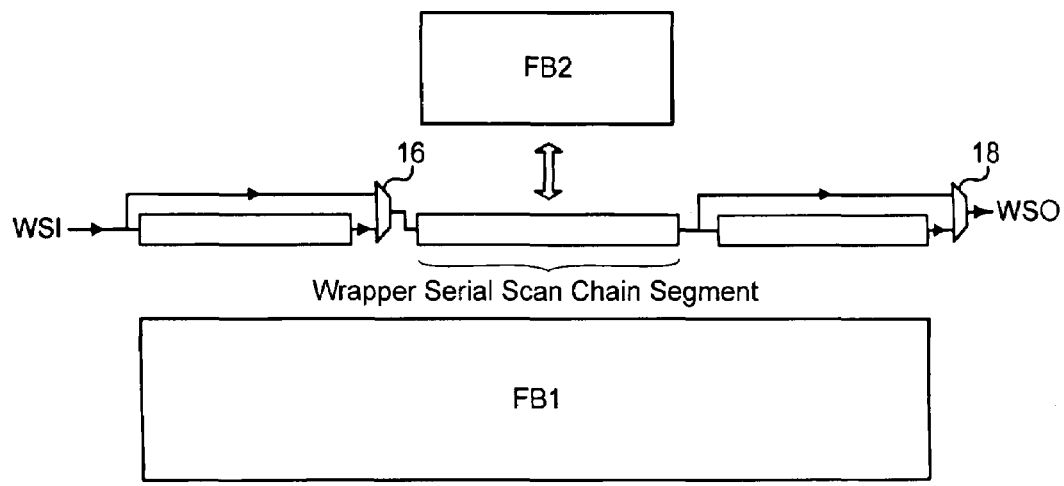

FIGS. 3 and 4 schematically illustrate two modes of operation of a wrapper serial scan chain 14. In FIG. 3 the full wrapper serial scan chain is being used and the test vectors scanned therein are applied to the first functional block of circuitry FB1. This corresponds to the normal mode of operation of such a wrapper serial scan chain. FIG. 4 illustrates a mode of operation in which multiplexers 16, 18 serve to bypass an initial and final portion of the wrapper serial scan chain respectively such that only a central portion of the wrapper serial scan chain is active. This central portion serves as the wrapper serial scan chain segment which is used to apply test signals to and capture test signals from the second functional block of circuitry FB2.

Figure 5:
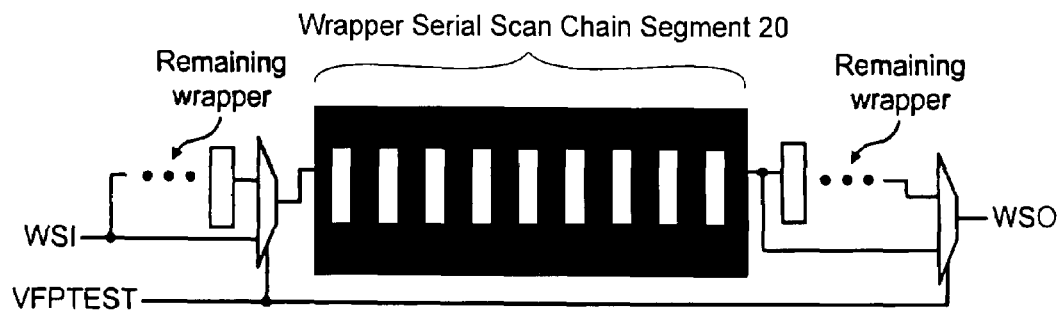
FIG. 5 is another view of a wrapper serial scan chain showing the wrapper serial scan chain cells associated with a particular functional block of circuitry.

FIG. 5 illustrates another embodiment of the invention in which the wrapper serial scan chain segment 20 is part of the wrapper serial scan chain of a microprocessor core and is reused to provide the wrapper serial scan chain of coprocessor, such as a vector floating point unit. This reduces the gate count of the overall system since separate circuit elements do not have to be provided to perform the role of a separate wrapper serial scan chain of the vector floating point unit. This technique has the consequence that it is desirable that the signal interface between the vector floating point and the microprocessor core should remain consistent and consistently routed through the wrapper serial scan chain across multiple designs in order to achieve the advantage of enabling the re-use of test vectors across different designs using the vector floating point unit. Thus, if the signal interface is kept consistent irrespective of the particular version of the microprocessor core being used or the particular version of the vector floating point unit (providing its functionality is consistent), then a common vector set may be developed and used with a consequent saving in the amount of time required to generate such test vector sets.

FIG. 6 schematically illustrates the arrangement of FIG. 5 in another way. In FIG. 6, the microprocessor core 22 and the vector floating point unit 24 are both connected to a wrapper serial scan chain 26. The wrapper serial scan chain segment 28 is functionally delimited as that portion which interfaces with the vector floating point unit 24 and reuses the same wrapper serial scan chain cells for the role of testing both the vector floating point unit 24 and a portion of the microprocessor core 22.

FIG. 6 shows the reuse of wrapper serial scan chain cells to provide the whole of the wrapper serial scan chain of another functional block of circuitry. However, there may be some functional blocks of circuitry which are able to share wrapper cells for part of their signal interface which is always common with another functional block of circuitry whilst requiring some of their own dedicated serial wrapper scan chain cells to deal with their unique control signals. An example of such a functional block of circuitry would be the embedded trace module 8 shown in FIG. 1 which interfaces both with the microprocessor core 4 and with external elements.

It will also be seen from FIG. 1 that the wrapper serial scan chains of these example embodiments take their input and output from external pins of the integrated circuit to enable manufacturing test.

Whilst not directly connected with the wrapper serial scan chain segmentation technique described above, a factor when testing integrated circuits in accordance with this technique is that should reset signals be present within the wrappers, then these should be appropriately gated when in the test modes to ensure that the wrapper serial scan chain cells are not inappropriately reset resulting in incorrect test operation. In a similar way enable signals used within wrapper serial scan chain cells should be carefully controlled to be held at a level whereby the scanning operation required during test is possible.

Figure 7:
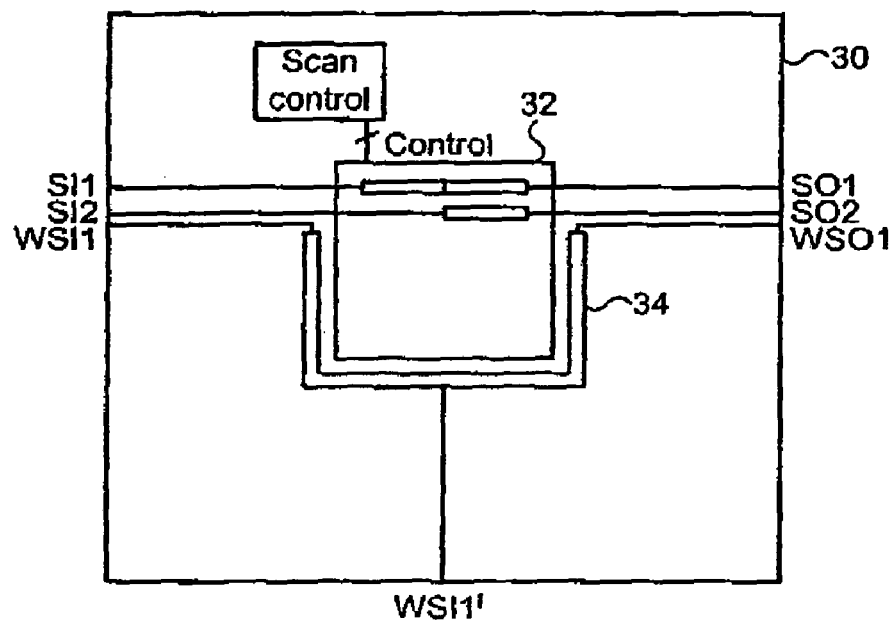
FIG. 7 schematically illustrates an integrated circuit with test signal connections to a functional block of circuitry.

FIG. 7 schematically illustrates an integrated circuit 30 including a functional block of circuitry 32 which has both a wrapper serial scan chain 34 and other test circuitry associated with it. The integrated circuit 30 of FIG. 7 includes many more functional blocks of circuitry as is consistent with a system-on-chip design, but these have been omitted from FIG. 7 for the sake of clarity. When a system-on-chip integrator produces their integrated circuit 30, they must combine the functional blocks of circuitry necessary and make the appropriate signal connections between those functional blocks of circuitry as well as between external pins and those functional blocks of circuitry. The making of these connections in the correct way is important for the correct operation of the integrated circuit 30 and requires validation before committing to the expense of manufacturing a particular design. Whilst the designer of a particular functional block of circuitry may have validated that their functional block of circuitry operates correctly in all circumstances providing the correct signals are applied to it, and have developed a set of test vectors for testing for correct manufacture of that functional block of circuitry, there is the complication that such testing circuitry associated with the functional block of circuitry 32 must be correctly connected to other elements internal of the integrated circuit 30, or more likely external of the integrated circuit 30, such that the appropriate test signals will be applied to the test circuitry during manufacturing tests.

The invention recognises that it is not necessary for the system-on-chip integrator to validate themselves the correct full operation of the test circuitry as this will already have been done by the originator of that design, rather what is required is to validate that the connections have been correctly made to that test circuitry. This reduces the amount of information that the originator of a design needs to release to the system-on-chip integrator and also reduces the workload of the system-on-chip integrator.

Figure 8:
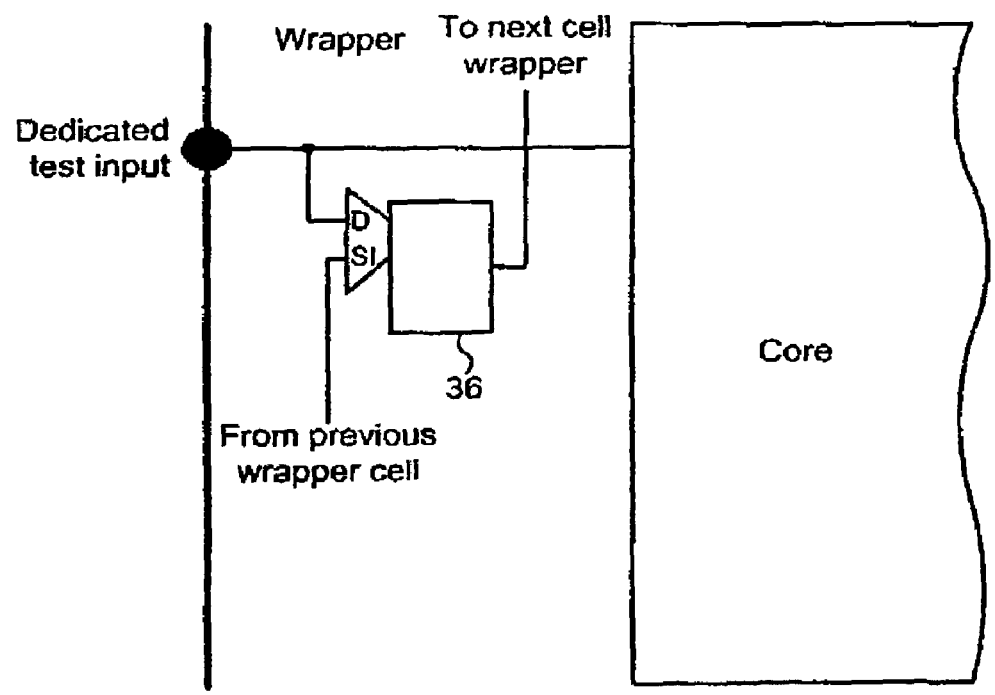
FIG. 8 illustrates the use of a wrapper serial scan chain cell to test a dedicated test input.

FIG. 8 illustrates the use of a wrapper serial scan chain cell 36 from within the wrapper serial scan chain 34 to be coupled to a dedicated test input to the functional block of circuitry 32 during a check mode for checking that that test signal connection has been made correctly. More particularly, in the check mode, the signal input to the dedicated test input is captured within the wrapper serial scan chain cell 36 from where it can be recovered by scanning out from the wrapper serial scan chain 34. It will be understood that the application of a test signal input, which if the connections have been made correctly should reach the dedicated test input in the appropriate form, the capture of this signal as it reaches the dedicated test input and the scanning out of this signal from the wrapper serial scan chain all take place in a simulation environment of the integrated circuit in order to validate the design of that integrated circuit. This simulated (validation) environment may be provided by one of a variety of different software tools. The wrapper serial scan chain cells 36 remain in place in the actual manufactured circuit as it would not be appropriate to change the design in any way after it has been validated and furthermore it may be desirable during manufacturing testing also to be able to check that the dedicated test inputs are correctly reaching their targets. This example shows wrapper serial scan chain cells within the wrapper for the functional circuitry being used to check the test connections. It would also be possible to provide a dedicated separate wrapper with its own cells and port to test the test connections.

Figure 9:
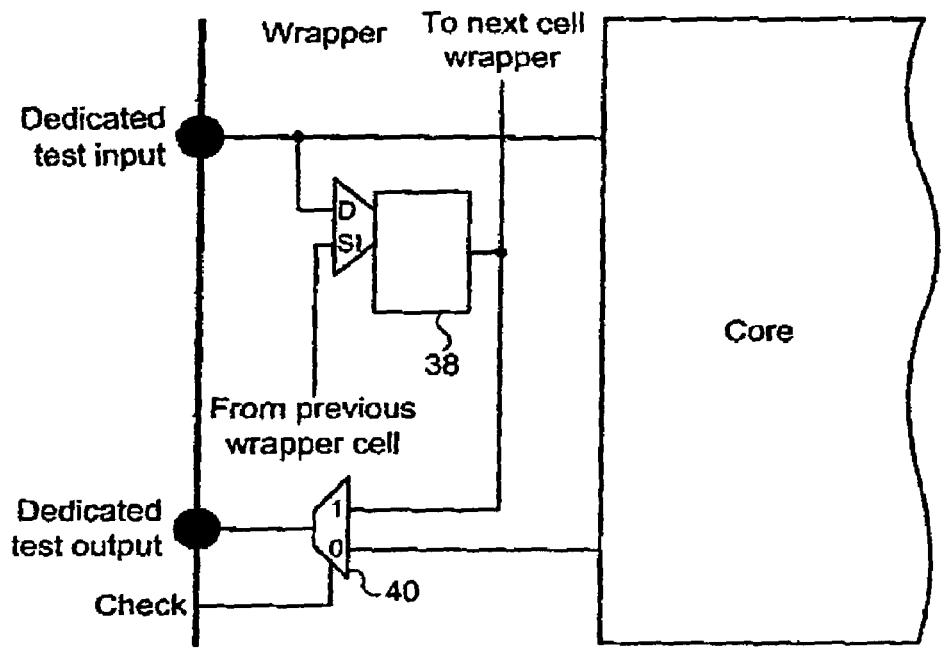
FIG. 9 illustrates the use of a wrapper serial scan chain cell associated with a dedicated test input to also test a dedicated test output.

FIG. 9 illustrates how a wrapper serial scan chain cell 38 may be shared to test both a dedicated test input and a dedicated test output. In the check mode, a test input signal is applied and captured by the wrapper serial scan chain cell 38. That same signal (which will be of a known value) is also selected by the multiplexer 40 in the check mode to be output from the dedicated test output and accordingly can be read at its intended destination to check that the dedicated test output is correctly connected to its intended destination. Thus, the connection to the dedicated test input is checked by scanning out captured data from the wrapper serial scan chain cell 38 and making sure that this corresponds to what was intended whilst the dedicated test output is checked by ensuring that the appropriate signal value reaches the intended destination having originated within the wrapper serial scan chain cell 38 and been routed via the multiplexer 40 to the dedicated test output of the functional block of circuitry.

Figure 10:
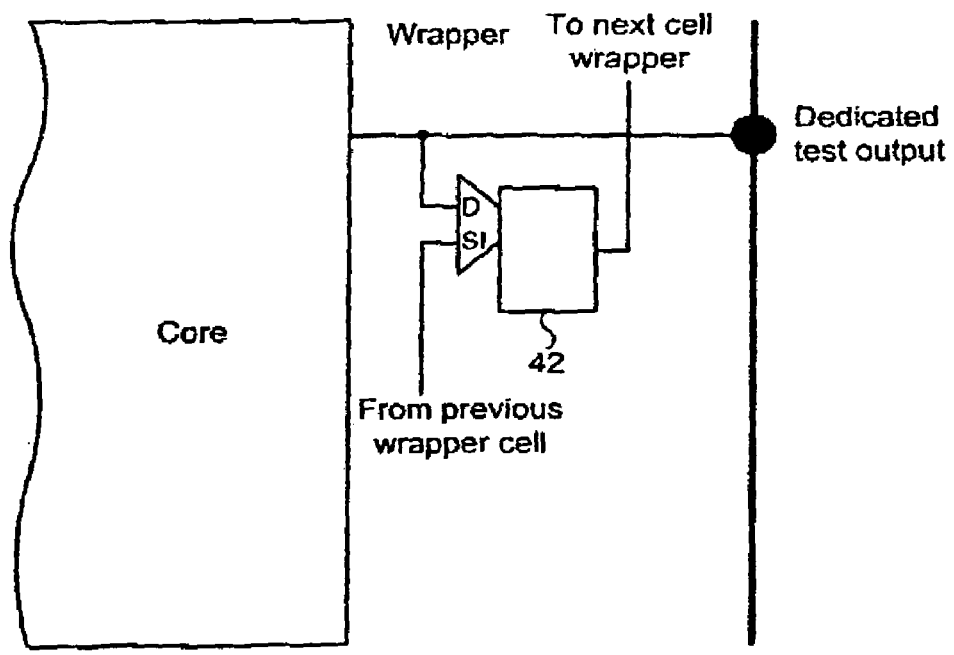
FIG. 10 illustrates the use of a wrapper serial scan chain cell to test a dedicated test output.

FIG. 10 illustrates another embodiment for testing dedicated test outputs. In this embodiment a dedicated wrapper serial scan chain cell 42 is provided purely for testing purposes of the dedicated test output. Accordingly, a test output signal which is to be generated is captured by the wrapper serial scan chain cell 42 and then routed via the dedicated test output and the associated test connection to its intended destination. The output signal applied by the wrapper cell will be known since it was scanned into the wrapper serial scan chain and thus may be compared with the value that reached its intended destination to ensure that they match.

Figure 11:
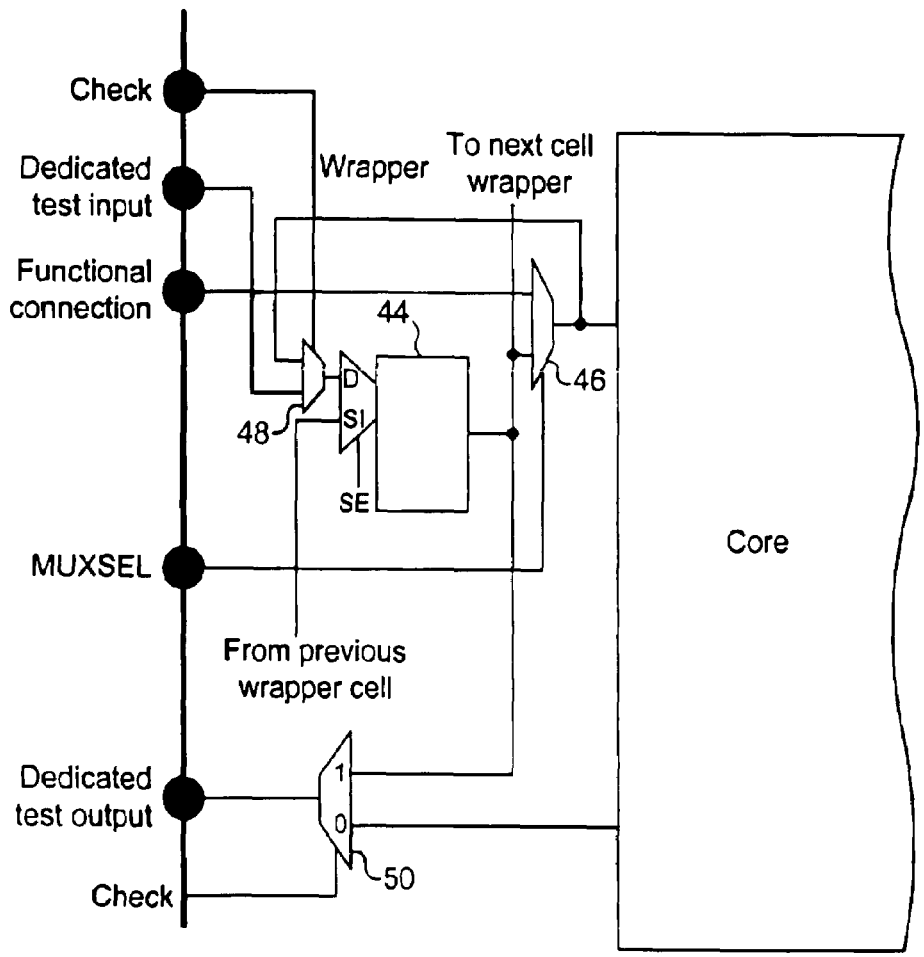
FIG. 11 illustrates the use of a wrapper serial scan chain cell that is associated with a normal functional signal (non-test) to also test a dedicated test input and a dedicated test output.

FIG. 11 illustrates another embodiment in which a wrapper serial scan chain cell 44 which is used in other than the check mode for wrapper testing of a functional connection may be used in the check mode for validating the correct connection of a dedicated test input and a dedicated test output. A multiplexer 46 controlled by a multiplexer control signal MUXSEL is used to select either the normal functional signal or a signal from the wrapper serial scan chain cell 44 to be applied to the functional block of circuitry.

When in a non-check mode, the functional signal being applied may be captured within the wrapper serial scan chain cell 44 via a feedback path from the multiplexer 46 or alternatively the functional connection may be driven with a signal within the wrapper serial scan chain 44 which has been scanned in as part of a test vector.

In the check mode, multiplexers 48, 50 serve to direct a signal received at the dedicated test input to be captured at the wrapper serial scan chain cell 44 whilst selecting a signal within the wrapper serial scan chain 44 to be output from the dedicated test output.

Figure 12:
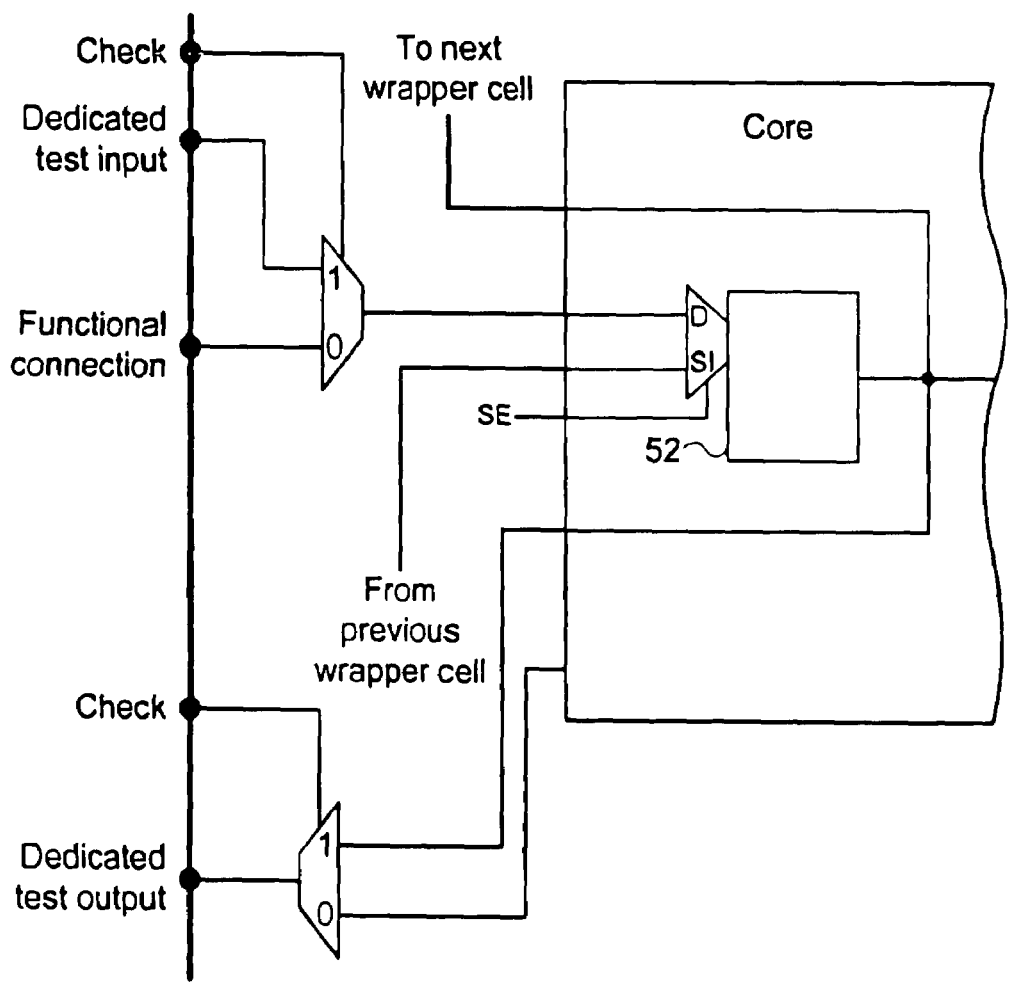
FIG. 12 illustrates a latch within a functional block of circuitry being reused as a wrapper serial scan chain cell for testing test connections.

FIG. 12 illustrates a further variation in which a latch 52 within the functional circuitry itself is reused as a wrapper serial scan chain cell. In non-check operation, the signal applied to the functional connection is routed to the latch 52. In check operation, the dedicated test input signal is routed to the latch 52 and a dedicated test output signal sourced from the latch 52. Whilst the embodiment of FIG. 12 reduces the gate requirement needed to provide the wrapper serial scan chain cells for test connection testing, it has the disadvantage of introducing an additional multiplexer (and consequent signal delay) in the functional signal path required during normal operation of the functional block of circuitry.

Figure 13:
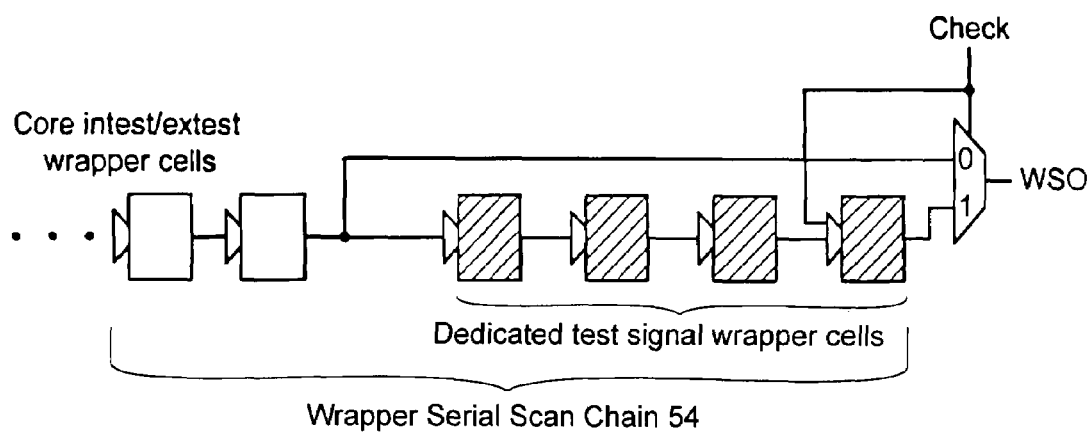
FIG. 13 schematically illustrates a wrapper serial scan chain in which dedicated test signal wrapper cells are bypassed when not operating in a check mode.

FIG. 13 illustrates a wrapper serial scan chain 54 including four dedicated wrapper serial scan chain cells which serve the purpose of testing test connections. These dedicated test signal wrapper cells are only normally used during validation of the design and not used during normal manufacturing test. Accordingly, in order to speed up normal manufacturing tests, these wrapper serial scan chain cells may be selectively bypassed using a multiplexer controlled by the check mode signal.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A testing circuit operable to test an integrated circuit having a first functional block of circuitry coupled to a second functional block of circuitry, said testing circuit comprising:
   at least one wrapper serial scan chain having a wrapper serial input and a wrapper serial output and being operable to apply a set of input signals to said first block of circuitry and to capture a set of output signals from said first block of circuitry; wherein
   said wrapper serial scan chain includes a wrapper serial scan chain segment operable to apply and to capture signals passed between said first functional block of circuitry and said second functional block of circuitry; and
   a segment selector operable to selectively connect said wrapper serial scan chain segment to said wrapper serial input and to said wrapper serial output whilst bypassing at least a portion of said wrapper serial scan chain outside of said wrapper serial scan chain segment such that a set of input signals can be applied to said second functional block of circuitry and a set of output signals captured from said second functional block of circuitry without requiring signal values to be scanned through all of said wrapper serial scan chain.

2. A testing circuit as claimed in claim 1, wherein said segment selector is operable to selectively bypass all of said wrapper serial scan chain other than said wrapper serial scan chain segment.

3. A testing circuit as claimed in claim 1, wherein said first functional block of circuitry is a microprocessor core.

4. A testing circuit as claimed in claim 3, wherein said second functional block of circuitry is one of:
   a coprocessor;
   a floating point unit;
   an embedded trace unit; and
   application specific logic coupled to said microprocessor core.

5. A testing circuit as claimed in claim 1, wherein a wrapper serial scan chain for said second functional block of circuitry is at least partially provided by said wrapper serial scan chain segment.

6. A testing circuit as claimed in claim 5, wherein said wrapper serial scan chain segment serves as a full wrapper serial scan chain for said second functional block of circuitry.

7. Testing circuit as claimed in claim 1, wherein said wrapper serial input and said wrapper serial output have respective corresponding external signal pins on said integrated circuit.

8. A method of testing an integrated circuit having a first functional block of circuitry coupled to a second functional block of circuitry, said method comprising the steps of:
   in a first test mode, using at least one wrapper serial scan chain having a wrapper serial input and a wrapper serial output to apply a set of input signals to said first block of circuitry and to capture a set of output signals from said first block of circuitry; and in a second test mode, selectively connecting a wrapper serial scan chain segment within said wrapper serial scan chain to said wrapper serial input and to said wrapper serial output whilst bypassing at least a portion of said wrapper serial scan chain outside of said wrapper serial scan chain segment and using said wrapper serial scan chain segment to apply and to capture signals passed between said first functional block of circuitry and said second functional block of circuitry without requiring signal values to be scanned through all of said wrapper serial scan chain.

9. A method as claimed in claim 8, wherein in said second mode all of said wrapper serial scan chain other than said wrapper serial scan chain segment is bypassed.

10. A method as claimed in claim 8, wherein said first functional block of circuitry is a microprocessor core.

11. A method as claimed in claim 10, wherein said second functional block of circuitry is one of:

a coprocessor;

a floating point unit;

an embedded trace unit; and application specific logic coupled to said microprocessor core.

12. A method as claimed in claim 8, wherein a wrapper serial scan chain for said second functional block of circuitry is at least partially provided by said wrapper serial scan chain segment.

13. A method as claimed in claim 12, wherein said wrapper serial scan chain segment serves as a full wrapper serial scan chain for said second functional block of circuitry.

14. A method as claimed in claim 8, wherein said wrapper serial input and said wrapper serial output have respective corresponding external signal pins on said integrated circuit.

* * * * *